US008475588B2

(12) United States Patent
Park

(10) Patent No.: US 8,475,588 B2
(45) Date of Patent: Jul. 2, 2013

(54) WAFER STRUCTURE AND EPITAXIAL GROWTH METHOD FOR GROWING THE SAME

(75) Inventor: Sung-Soo Park, Seongnam-si (KR)

(73) Assignee: Samsung Corning Precision Materials Co., Ltd., Gyeongsangbuk-do (KR)

(*) Notice: Subject to any disclaimer, the term of this patent is extended or adjusted under 35 U.S.C. 154(b) by 1146 days.

(21) Appl. No.: 12/382,329

(22) Filed: Mar. 13, 2009

(65) Prior Publication Data

US 2009/0181525 A1 Jul. 16, 2009

Related U.S. Application Data

(62) Division of application No. 11/326,172, filed on Jan. 6, 2006, now abandoned.

(30) Foreign Application Priority Data

Jan. 7, 2005 (KR) .................. 10-2005-0001540

(51) Int. Cl.
*C30B 1/02* (2006.01)

(52) U.S. Cl.
USPC ............ 117/4; 117/5; 117/8; 117/9; 117/100; 117/101

(58) Field of Classification Search
USPC .................. 117/4, 5, 8, 9, 96, 100, 101
See application file for complete search history.

(56) References Cited

U.S. PATENT DOCUMENTS

| 6,579,359 B1 | 6/2003 | Mynbaeva et al. ............ 117/94 |
| 6,844,569 B1 | 1/2005 | Lee et al. ........................ 257/79 |
| 2003/0207125 A1 | 11/2003 | Sunakawa et al. ............ 428/428 |
| 2004/0183090 A1 | 9/2004 | Kitaoka et al. ................ 257/103 |
| 2005/0051766 A1* | 3/2005 | Stokes et al. .................... 257/17 |

FOREIGN PATENT DOCUMENTS

| JP | 2001-122693 | 5/2001 |
| JP | 2002-161000 | 6/2002 |
| JP | 2002-261014 | 9/2002 |
| JP | 2002-293699 | 10/2002 |
| JP | 2003-022973 | 1/2003 |
| JP | 2003-078215 | 3/2003 |
| JP | 2003-197541 | 7/2003 |
| JP | 2004-059325 | 2/2004 |
| JP | 2005-202164 | 7/2005 |
| KR | 10-2005-0051169 | 6/2001 |
| WO | WO 2004/003266 | 1/2004 |

OTHER PUBLICATIONS

Office Action for Japanese patent application No. 2005-376483 dated Apr. 11, 2012.
Office Action for corresponding Korean Application No. 10-2005-0001540 dated May 23, 2006 and English translation thereof.
Office Action for Japanese patent application No. 2005-376483 dated Feb. 22, 2011 (with English translation).

* cited by examiner

*Primary Examiner* — Bob M Kunemund
(74) *Attorney, Agent, or Firm* — Harness, Dickey & Pierce, P.L.C.

(57) ABSTRACT

A wafer structure and epitaxial growth method for growing the same. The method may include forming a mask layer having nano-sized areas on a wafer, forming a porous layer having nano-sized pores on a surface of the wafer by etching the mask layer and a surface of the wafer, and forming an epitaxial material layer on the porous layer using an epitaxial growth process.

11 Claims, 3 Drawing Sheets

WAFER STRUCTURE AND EPITAXIAL GROWTH METHOD FOR GROWING THE SAME

PRIORITY STATEMENT

This is a division of, and claims priority under 35 U.S.C. §120 to, U.S. patent application Ser. No. 11/326,172, filed Jan. 6, 2006, now abandoned the entire contents of all of which are hereby incorporated by reference in its entirety. This application claims the benefit of Korean Patent Application No. 10-2005-0001540, filed on Jan. 7, 2005, in the Korean Intellectual Property Office, the disclosure of which is incorporated herein in its entirety by reference.

BACKGROUND

1. Field

Example embodiments of the present invention relate to a wafer structure and epitaxial growth method for growing the same, more particularly, to a GaN epitaxial growth method.

2. Description of the Related Art

A substrate on which an epitaxial layer is formed using an epitaxial growth method may be bent and many crystalline defects may arise in the epitaxial layer due to lattice mismatch and/or a difference in coefficients of thermal expansion between the substrate and the epitaxial layer.

Conventional art discloses a technique of using a porous buffer layer that absorbs internal stress. In this technique, the porous buffer layer is formed on a SiC substrate, and an epitaxial layer is formed on the porous buffet layer. Because the buffer layer is porous, it absorbs stress induced by lattice mismatch.

However, because the porous buffer layer may be formed using an anodization process, a conductive substrate should be employed, thus only limited kinds of materials may be used for the substrate. Also, the anodization method may be complicated and/or costly.

SUMMARY

Example embodiments of the present invention provide a wafer structure and epitaxial growth method for growing the same.

Example embodiments of the present invention provide a wafer structure and a method of forming a semiconductor epitaxial layer at lower cost by more easily forming a porous buffer layer.

According to an example embodiment of the present invention, there is provided an epitaxial growth method including forming a mask layer having nano-sized areas on a wafer, forming a porous layer having nano-sized pores on a surface of the wafer by etching the mask layer and a surface of the wafer, and forming an epitaxial material layer on the porous layer using an epitaxial growth process.

According to an example embodiment of the present invention, there is provided a wafer structure including a substrate, a porous layer having nano-sized pores on a surface of the substrate, and an epitaxially formed material layer on the porous layer.

According to an example embodiment of the present invention, there is provided an optical device including the wafer structure.

In example embodiments of the present invention, the epitaxial material layer may be formed of a group III nitride semiconductor.

In an example embodiment, the single crystalline wafer may be an $Al_2O_3$ wafer, and the mask layer may be formed of AlN.

In an example embodiment, the AlN mask layer may be formed using a halide or hydride vapor phase epitaxy (HVPE) process. In an example embodiment, the mask layer may be formed of a material having a lower etch rate than the single crystalline wafer.

In an example embodiment, the epitaxial material layer may be formed using a vapor deposition process, for example, one of an HVPE process, a metal organic chemical vapor deposition (MOCVD), and a molecular beam epitaxy (MBE) process.

In an example embodiment, the epitaxial material layer may be annealed at a temperature of 850° C. or higher.

BRIEF DESCRIPTION OF THE DRAWINGS

The above and other features and advantages of example embodiments of the present invention will become more apparent by describing in detail example embodiments thereof with reference to the attached drawings in which.

DETAILED DESCRIPTION OF EXAMPLE EMBODIMENTS OF THE INVENTION

Figure 1:
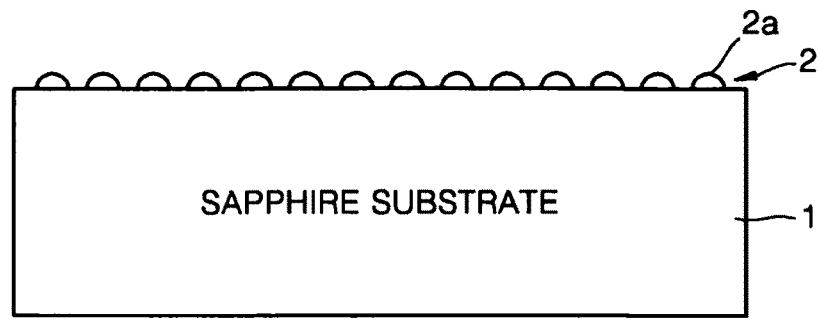
FIGS. 1 through 4 are cross sectional views illustrating an epitaxial growth method according to an example embodiment of the present invention.

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments of the present invention.

Spatially relative terms, such as "beneath", "below", "lower", "above", "upper" and the like, may be used herein for ease of description to describe one element or a feature's relationship to another element or feature as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Also, the use of the words "compound," "compounds," or "compound(s)," refer to either a single compound or to a plurality of compounds. These words are used to denote one or more compounds but may also just indicate a single compound.

Example embodiments of the present invention are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments of the invention should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope of the present invention.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments of the present invention belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments of the present invention, various aspects of the present invention will be described in detail with reference to the attached drawings. However, the present invention is not limited to the example embodiments described. In the figures, if a layer is formed on another layer or a substrate, it means that the layer is directly formed on another layer or a substrate, or that a third layer is interposed therebetween. In the following description, the same reference numerals denote the same elements.

An epitaxial growth method according to example embodiments the present invention will now be described more fully hereinafter with reference to the accompanying drawings, in which example embodiments of the invention are shown.

Referring to FIG. 1, a mask layer 2 having nano-sized areas 2a (for example, dots) may be formed on the surface of a single crystalline wafer 1, for example, an $Al_2O_3$ (sapphire) wafer (hereinafter, an $Al_2O_3$ wafer 1). The mask layer 2 may be formed using a known halide or hydride vapor phase epitaxy (HVPE) process.

In an example embodiment, the $Al_2O_3$ wafer 1 is loaded into a horizontal HVPE reactor, and an internal temperature of a reactor may be raised to a growth temperature of about 1050° C. Thereafter, HCl and $NH_3$ gas may be mixed with $N_2$ gas in a ratio of 1:10, and the mixture may be injected into the reactor for about 5 minutes so that AlN areas 2a form on the $Al_2O_3$ wafer 1. The reactor may be cooled to a room temperature, and the $Al_2O_3$ wafer 1 may be unloaded from the reactor.

In an example embodiment, the surface roughness of the $Al_2O_3$ wafer 1 on which the nano-sized areas 2a are formed may increase from several Å to several tens of Å.

Figure 2:
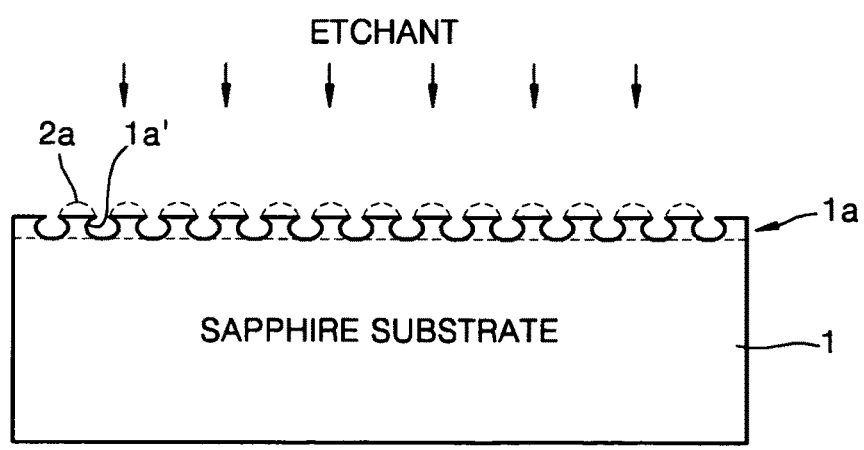

Referring to FIG. 2, a porous buffer layer 1a may be formed on the $Al_2O_3$ wafer 1 using an etching process. In order to form the porous buffer layer 1a, an etchant having a higher solubility with respect to the $Al_2O_3$ wafer 1 than the mask layer 2 may be employed. In an example embodiment, portions of the $Al_2O_3$ wafer 1, which are not covered with the areas 2a, are etched at a higher rate, while the mask layer 2 is etched at a lower rate. The etching process may be continued until the mask layer 2 is removed and pores 1a' are formed to a diameter and depth of several tens of nm. As a result, as shown in FIG. 2, the porous buffer layer 1a having nano-sized pores 1a' may be formed on a surface of the $Al_2O_3$ wafer 1.

Figure 3:
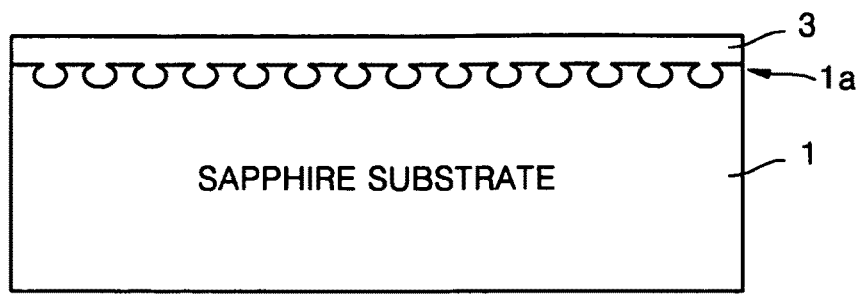

Referring to FIG. 3, a desired epitaxial material layer 3 may be formed on the buffer layer 1a using a conventional epitaxial growth process. For example, in order to form the epitaxial material layer 3 using a group III nitride semiconductor, the $Al_2O_3$ wafer 1 may be loaded into an HVPE reactor, a reaction between HCl and Ga occurs, thus generating GaCl, and a reaction between GaCl and $NH_3$ gas occurs, thus growing the GaN epitaxial material layer 3 to a thickness of several μm on the surface of the $Al_2O_3$ wafer 1. During the epitaxial growth process, process conditions may be controlled such that epitaxial growth rate measured in a horizontal direction is higher than epitaxial growth rate measured in a vertical direction.

Once the epitaxial growth process is finished, the HVPE reactor may be cooled to a room temperature, and the $Al_2O_3$ wafer 1 on which the GaN semiconductor epitaxial material layer 3 is grown may be unloaded from the HVPE reactor.

Figure 4:
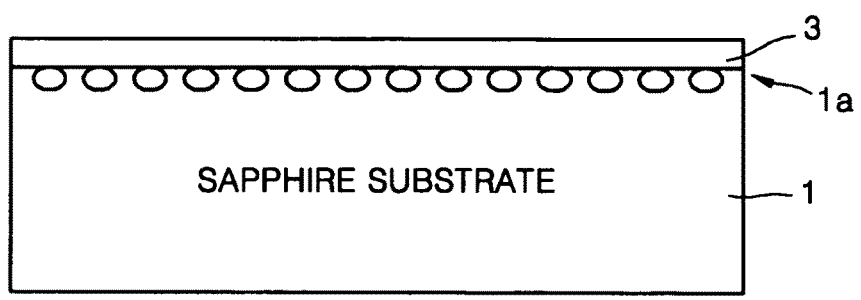

Referring to FIG. 4, the epitaxial material layer 3 may be annealed using a rapid thermal annealing (RTA) process. In an example embodiment, the $Al_2O_3$ wafer 1 may be loaded in a furnace that is maintained in an $NH_3$ atmosphere and then annealed at a temperature of 850° C. or higher.

Through the above-described example process, a desired epitaxial material layer 3 may be formed on an $Al_2O_3$ wafer 1.

When an example GaN epitaxial material layer was formed through the above-described processes, the following example measurements were obtained. That is, the GaN epitaxial material layer had a defect density of about $5 \times 10^7/cm^2$ that is less than a conventional defect density of $5 \times 10^9 \, cm^2$ and had about ⅕ of a strain stress of a conventional GaN layer.

An optical device may be directly formed on the wafer 1 that has undergone the above-described example processes. Alternately, to obtain a freestanding GaN wafer, the $Al_2O_3$ wafer 1 may be loaded again in the HVPE reactor and another GaN epitaxial material layer may be further grown on the GaN epitaxial material layer 3 to a thickness of about 300 μm or more. The $Al_2O_3$ wafer 1 may be removed using a known laser lift-off process, thus achieving a high-quality freestanding GaN wafer having a defect density of about $5 \times 10^5 \, cm^2$.

Figure 5:
FIG. 5 is a scanning electron microscopic (SEM) image of an $Al_2O_3$ wafer having AlN dots that is obtained by a method according to an example embodiment of the present invention.

FIG. 5 is a scanning electron microscopic (SEM) image of an example $Al_2O_3$ wafer having AlN dots that may be obtained by an example method of the present invention. The surface roughness of the $Al_2O_3$ wafer measured before the AlN dots were formed was 3.16 Å, whereas the surface roughness of the $Al_2O_3$ wafer measured after the AlN dots were formed was 21.3 Å. In FIG. 5, a lump on the lower right side is extraneous matter.

According to example embodiments of the present invention, a porous buffer layer may be formed on a single crystalline wafer using an etching process. In particular, a mask layer may be formed to obtain the porous buffer layer due to a surface reaction of the wafer. Because the porous buffer layer may be formed using an etching process, the wafer can be formed of a wide variety of materials.

Also, example embodiments of the present invention may reduce the defect density, stress, and/or bending degree of an epitaxial growth substrate, thus enabling formation of a higher-quality semiconductor wafer and/or increasing yield. Further, due to improvements in the above-described physical properties, it is possible to fabricate an epitaxial growth semiconductor wafer with a greater diameter.

In addition, example embodiments of the present invention may be appropriate for a single crystalline semiconductor wafer that is formed dependent upon another substrate, for example, a group III nitride semiconductor wafer, for example, a GaN wafer.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. An epitaxial growth method comprising:
   providing a single crystalline aluminium oxide wafer;
   forming an epitaxial mask layer of AlN having nano-sized areas on a wafer;
   forming a porous layer having nano-sized pores on a surface of the wafer by etching the mask layer and a surface of the wafer; and
   forming an epitaxial material layer on the porous layer using an epitaxial growth process.

2. The method according to claim 1, further comprising:
   annealing the epitaxial material layer.

3. The method according to claim 2, wherein annealing of the epitaxial material layer is performed at a temperature of 850° C. or higher.

4. The method according to claim 1, wherein the epitaxial material layer is formed of a group III nitride semiconductor.

5. The method according to claim 1, wherein the epitaxial material layer is a GaN layer.

6. The method according to claim 1, wherein the epitaxial material layer is formed using a vapor deposition process.

7. The method according to claim 6, wherein the vapor deposition process is one selected from the group consisting of a halide or hydride vapor phase epitaxy (HVPE) process, a metal organic chemical vapor deposition (MOCVD), and a molecular beam epitaxy (MBE) process.

8. The method according to claim 1, wherein the mask layer is formed of a material having a lower etch rate than the single crystalline wafer.

9. The method according to claim 1, wherein the AlN mask layer is formed using a halide or hydride vapor phase epitaxy (HVPE) process.

10. The method according to claim 1, wherein the porous layer is formed and the mask layer is completely removed in a single etching step.

11. The method according to claim 1, wherein forming the epitaxial material layer includes forming the epitaxial material layer having a defect density of $5\times10^7/cm^2$.

* * * * *